(12) United States Patent
Akhavan et al.

(10) Patent No.: US 11,569,837 B1
(45) Date of Patent: Jan. 31, 2023

(54) OUTPUT COMMON-MODE CONTROL FOR DYNAMIC AMPLIFIERS

(71) Applicant: QUALCOMM Incorporated, San Diego, CA (US)

(72) Inventors: Aram Akhavan, San Diego, CA (US); Kentaro Yamamoto, San Diego, CA (US); Lei Sun, San Diego, CA (US); Ganesh Kiran, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/403,683

(22) Filed: Aug. 16, 2021

(51) Int. Cl.
  *H03M 1/12* (2006.01)
  *H03M 1/16* (2006.01)
  *H03F 3/45* (2006.01)

(52) U.S. Cl.
  CPC ........ *H03M 1/164* (2013.01); *H03F 3/45179* (2013.01); *H03M 1/124* (2013.01)

(58) Field of Classification Search
  CPC .... H03M 1/164; H03M 1/124; H03F 3/45179
  USPC .................................. 341/155, 172
  See application file for complete search history.

(56) References Cited

U.S. PATENT DOCUMENTS

| | | | | |
|---|---|---|---|---|
| 10,454,435 | B2 * | 10/2019 | Liu | H03F 3/72 |
| 10,840,865 | B1 * | 11/2020 | Banerjee | H03F 3/45269 |
| 10,979,064 | B2 * | 4/2021 | Kinyua | H03M 1/164 |
| 2004/0036453 | A1 * | 2/2004 | Rossi | H03F 3/005 |
| | | | | 341/161 |
| 2004/0160351 | A1 * | 8/2004 | Rossi | H03F 3/005 |
| | | | | 341/161 |
| 2012/0313703 | A1 | 12/2012 | Agrawal et al. | |
| 2021/0234549 | A1 * | 7/2021 | Kinyua | H03F 3/4565 |

FOREIGN PATENT DOCUMENTS

EP  3588775 A1  1/2020

OTHER PUBLICATIONS

International Search Report and Written Opinion—PCT/US2022/074539—ISA/EPO—dated Nov. 28, 2022.
Lin J., et al., "An Ultra-Low-Voltage 160 MS/s 7 Bit Interpolated Pipeline ADC Using Dynamic Amplifiers", IEEE Journal of Solid-State Circuits, USA, vol. 50, No. 6, Jun. 1, 2015, pp. 1399-1411, XP011582284, ISSN:0018-9200, DOI: 10.1109/JSSC.2015.2415472, [retrieved on May 22, 2015], Section B entitled "Dynamic Amplifier With Common-Mode Detection", p. 1402 -p. 1404, figures 2, 5, 6.

* cited by examiner

*Primary Examiner* — Jean B Jeanglaude
(74) *Attorney, Agent, or Firm* — Patterson & Sheridan, LLP

(57) ABSTRACT

Techniques and apparatus for output common-mode control of dynamic amplifiers, as well as analog-to-digital converters (ADCs) and other circuits implemented with such dynamic amplifiers. One example amplifier circuit includes a dynamic amplifier and a current source. The dynamic amplifier generally includes differential inputs, differential outputs, transconductance elements coupled to the differential inputs, a first set of capacitive elements coupled to the differential outputs, and a control input for controlling a time length of amplification for the dynamic amplifier. The current source is configured to generate an output current such that portions of the output current are selectively applied to the differential outputs of the dynamic amplifier during at least a portion of the time length of amplification.

30 Claims, 11 Drawing Sheets

OUTPUT COMMON-MODE CONTROL FOR DYNAMIC AMPLIFIERS

FIELD OF THE DISCLOSURE

Certain aspects of the present disclosure generally relate to electronic components and, more particularly, to dynamic amplifiers.

BACKGROUND

Electronic devices include computing devices such as desktop computers, notebook computers, tablet computers, smartphones, wearable devices like a smartwatch, Internet servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various types of communication content such as voice, video, packet data, messaging, broadcast, and so on. These systems may be capable of supporting communication with multiple users by sharing the available system resources (e.g., time, frequency, and power). Examples of such systems include code division multiple access (CDMA) systems, time division multiple access (TDMA) systems, frequency division multiple access (FDMA) systems, and orthogonal frequency division multiple access (OFDMA) systems (e.g., a Long Term Evolution (LTE) system or a New Radio (NR) system).

Wireless devices in these and other communication systems may include one or more analog-to-digital converters (ADCs), for converting received, amplified, filtered, and downconverted analog signals to digital signals for additional signal processing in the digital domain, for example. Several types of ADCs are available, some more suitable for particular applications than others. For example, a successive approximation register (SAR) ADC may provide an area and power-efficient architecture for low-to-medium accuracy analog-to-digital conversion applications. A SAR ADC may use a digital-to-analog converter (DAC) and a comparator to approximate a digital value corresponding to an analog input. Another type of ADC referred to as a flash ADC may provide a faster conversion speed at the cost of an exponential increase in power and area consumption compared to a SAR ADC. Another type of ADC with faster sampling rates than SAR ADCs, but lower power and area consumption than flash ADCs is referred to as a pipelined ADC.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide the advantages described herein.

Certain aspects of the present disclosure generally relate to dynamic amplifiers with output common-mode control and to analog-to-digital converters (ADCs) and other circuits implemented with such dynamic amplifiers.

Certain aspects of the present disclosure provide an amplifier circuit. The amplifier circuit generally includes a dynamic amplifier having differential inputs, differential outputs, transconductance elements coupled to the differential inputs, a first set of capacitive elements coupled to the differential outputs, and a control input for controlling a time length of amplification for the dynamic amplifier; and a current source configured to generate an output current such that portions of the output current are selectively applied to the differential outputs of the dynamic amplifier during at least a portion of the time length of amplification.

Certain aspects of the present disclosure provide an analog-to-digital converter including the amplifier circuit described herein.

Certain aspects of the present disclosure provide a receive path for a wireless device. The receive path generally includes an analog-to-digital converter including the amplifier circuit described herein.

Certain aspects of the present disclosure provide a pipelined analog-to-digital converter (ADC). The pipelined ADC generally includes a first converter stage having one or more inputs, a digital output, and differential residue outputs; a first amplifier circuit having differential inputs coupled to the differential residue outputs of the first converter stage, wherein the first amplifier circuit comprises: a dynamic amplifier having differential inputs coupled to the differential inputs of the first amplifier circuit, having differential outputs, and having a control input for controlling a time length of amplification for the dynamic amplifier; and a current source configured to generate an output current such that portions of the output current are selectively applied to the differential outputs of the dynamic amplifier during at least a portion of the time length of amplification; and a second converter stage having differential inputs and a digital output, wherein differential outputs of the first amplifier circuit are coupled to the differential inputs of the second converter stage.

Certain aspects of the present disclosure provide an amplifier circuit. The amplifier circuit generally includes a dynamic amplifier having differential inputs and differential outputs; and a current source selectively coupled to the differential outputs of the dynamic amplifier.

Certain aspects of the present disclosure provide a method for signal amplification. The method generally includes controlling, via a control input of a dynamic amplifier, a time length of amplification for the dynamic amplifier, the dynamic amplifier comprising differential inputs, differential outputs, transconductance elements coupled to the differential inputs, and a first set of capacitive elements coupled to the differential outputs; generating, via a current source, an output current; and selectively applying portions of the output current to the differential outputs of the dynamic amplifier during at least a portion of the time length of amplification.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure generally relate to dynamic amplifiers with output common-mode control and to analog-to-digital converters (ADCs) and other circuits implemented with such dynamic amplifiers. For example, certain aspects provide an amplifier circuit comprising a dynamic amplifier and a current source selectively coupled to differential outputs of the dynamic amplifier. The current source may be a fixed current source or a dynamic current source, which may be adjusted in a feedback loop based on sensing the common-mode output of the dynamic amplifier. The application of a common-mode counter current from the current source to the differential outputs may control (e.g., reduce) a common-mode voltage shift (e.g., drop) at the differential outputs during amplification. By controlling the output common-mode voltage, the maximum achievable gain of the dynamic amplifier can be increased, which may enhance the performance of ADCs and other circuits employing such a dynamic amplifier.

Example Wireless Communications

Figure 1:
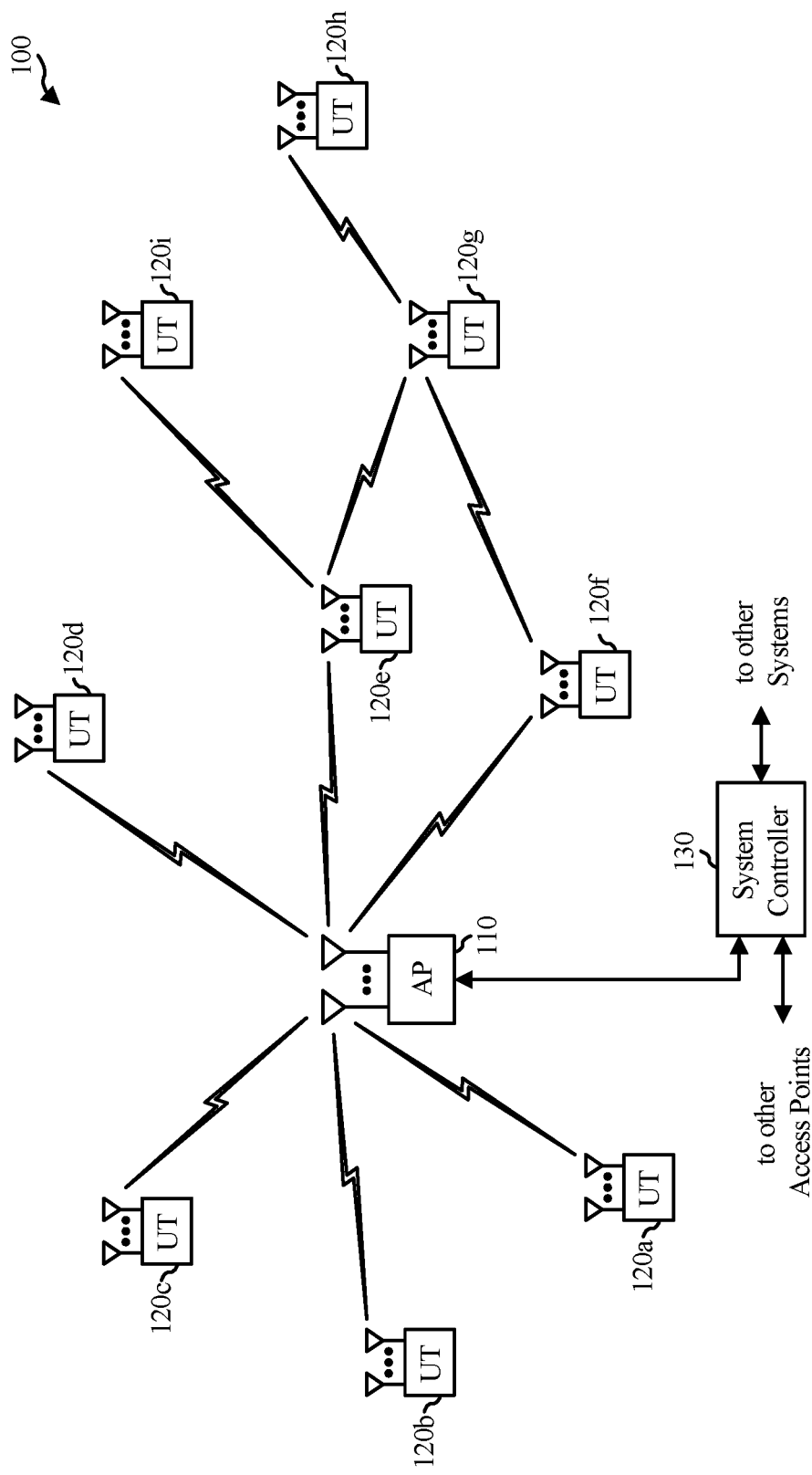
FIG. 1 is a diagram of an example wireless communications network, in which aspects of the present disclosure may be practiced.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), a next generation Node B (gNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

Wireless communications system 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless communications system 100 may be a time division duplex (TDD) system or a frequency division duplex (FDD) system. For a TDD system, the downlink and uplink share the same frequency band. For an FDD system, the downlink and uplink use different frequency bands. Wireless communications system 100 may also utilize a single carrier or multiple carriers for transmission. Each user terminal 120 may be equipped with a single antenna (e.g., to keep costs down) or multiple antennas (e.g., where the additional cost can be supported). In some aspects, the user terminal 120 or access point 110 may include a dynamic amplifier circuit with output common-mode control or an analog-to-digital converter (ADC) implemented with such a dynamic amplifier circuit, as described in more detail herein.

Figure 2:
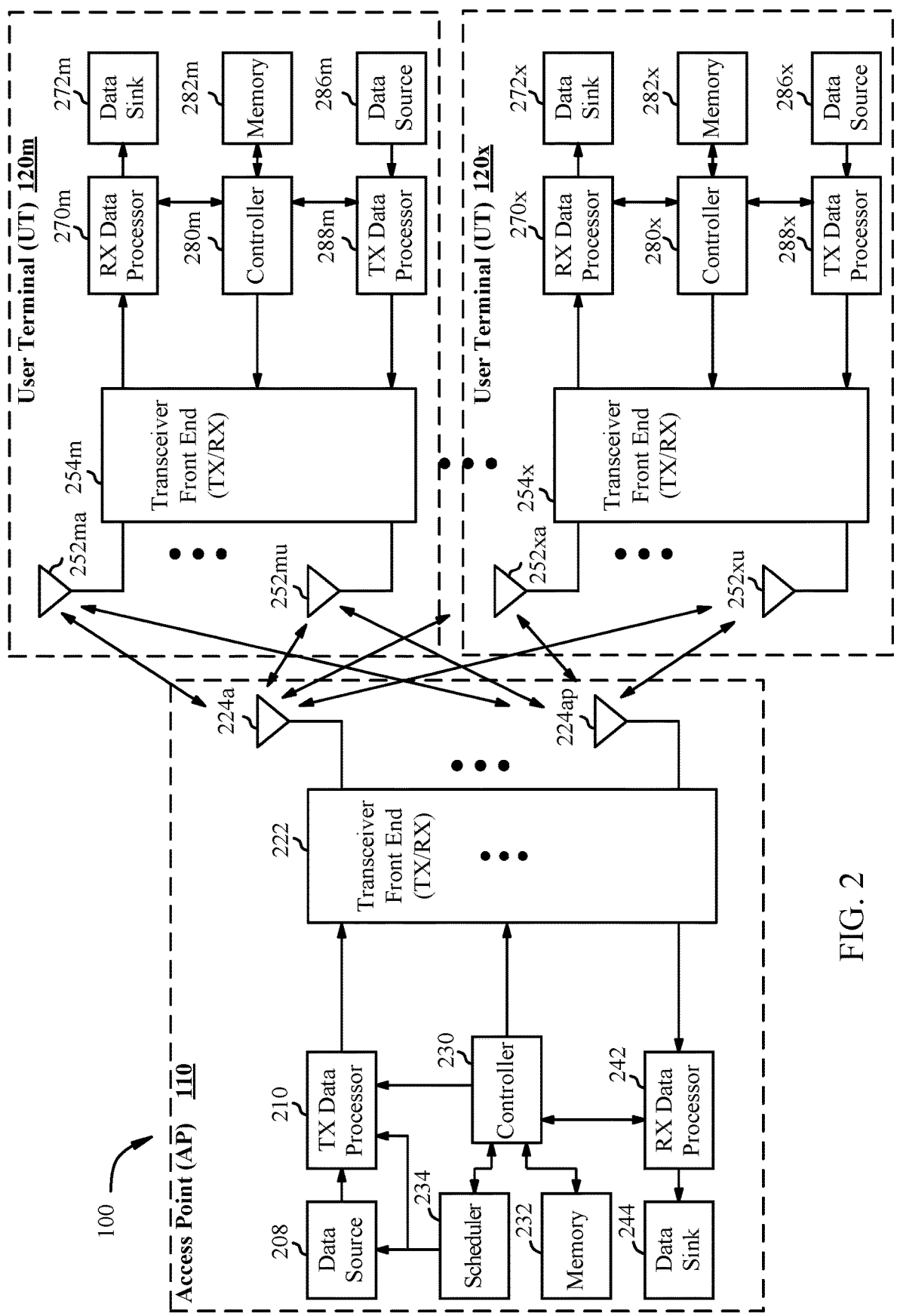
FIG. 2 is a block diagram of an example access point (AP) and example user terminals, in which aspects of the present disclosure may be practiced.

FIG. 2 shows a block diagram of access point 110 and two user terminals 120m and 120x in the wireless communications system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering, beamforming, or some other spatial processing technique may be used at the access point and/or user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one or more of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal. In some aspects, the transceiver front end 254 or 222 may include an ADC implemented with a dynamic amplifier circuit having output common-mode control, as described in more detail herein.

Figure 3:
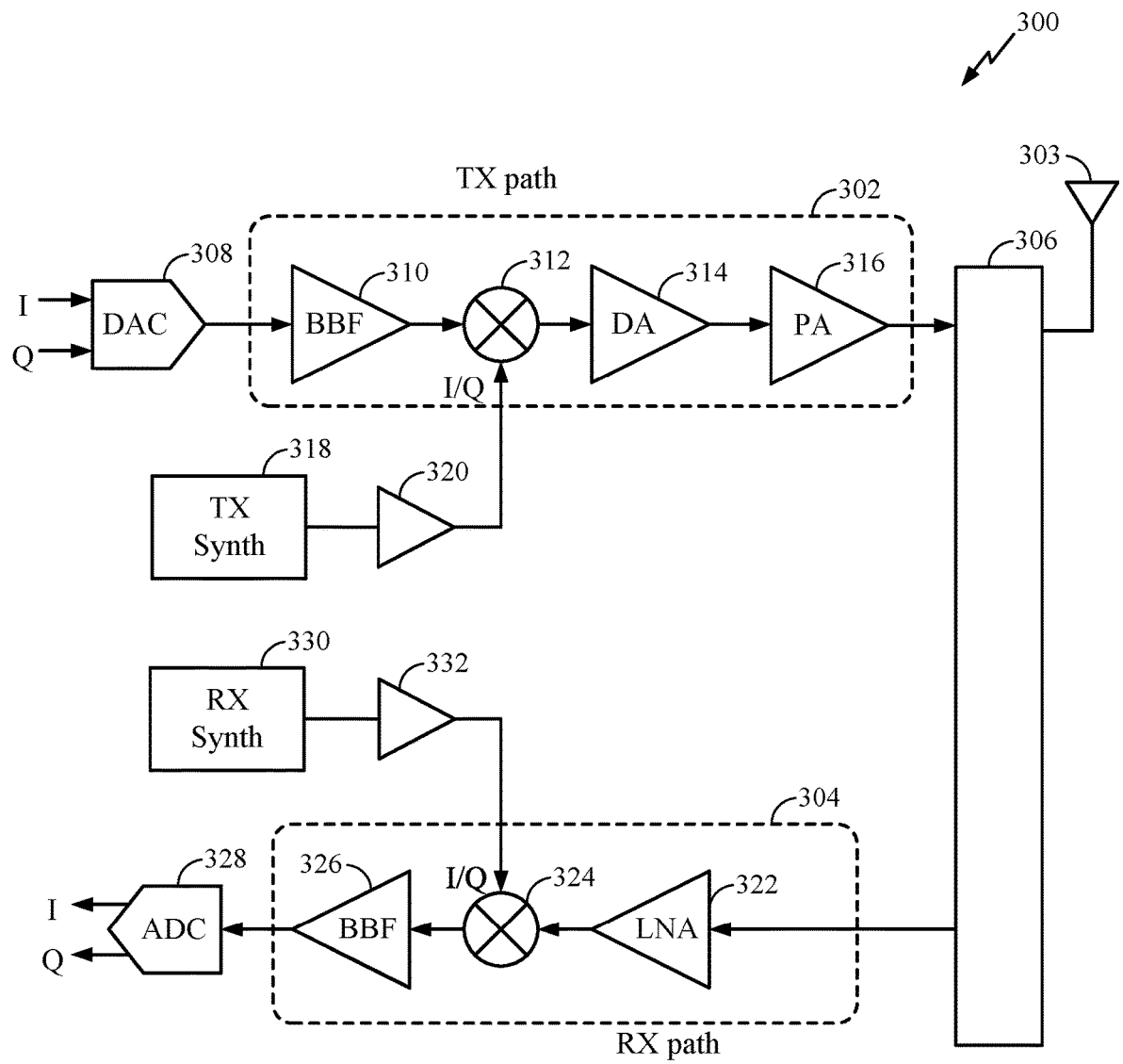
FIG. 3 is a block diagram of an example transceiver front end, in which aspects of the present disclosure may be practiced.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a "transmit chain") for transmitting signals via one or more antennas and a receive (RX) path 304 (also known as a "receive chain") for receiving signals via the antennas. When the TX path 302 and the RX path 304 share an antenna 303, the paths may be connected with the antenna via an interface 306.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC.

The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency-conversion process produces the sum and difference frequencies of the LO frequency and the frequency of the signal of interest. The sum and difference frequencies are referred to as the "beat frequencies." The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing. For certain aspects, the ADC 328 may be implemented as a pipelined ADC and/or may include a dynamic amplifier circuit having output common-mode control, as described herein.

While it may be desirable for the output of an LO to remain stable in frequency, tuning the LO to different frequencies typically entails using a variable-frequency oscillator, which may involve compromises between stability and tunability. Some systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

While FIGS. 1-3 provide a wireless communications system as an example application in which certain aspects of the present disclosure may be implemented to facilitate understanding, certain aspects described herein may be used for amplification and/or analog-to-digital conversion in any of various other suitable systems. For example, the dynamic amplifier described herein may be used in any circuit involving analog multiplication where the output is a capacitance (e.g., has a capacitive component), such as a switched-capacitor filter, a class-H audio amplifier, a delta-sigma converter, or a mixer (e.g., an RF mixer, such as mixer 312 or mixer 324).

Example Pipelined Analog-to-Digital Converter with Dynamic Amplifier

A pipelined analog-to-digital converter (ADC) may be used for high performance analog-to-digital conversion in a device (e.g., a $5^{th}$ generation (5G) transceiver in a receive chain of a transceiver front end, such as transceiver front end 300 of FIG. 3). The pipelined ADC may be used, for example, with sampling rates from a few megasamples per second (Msps) to 1000 Msps+.

Figure 4:
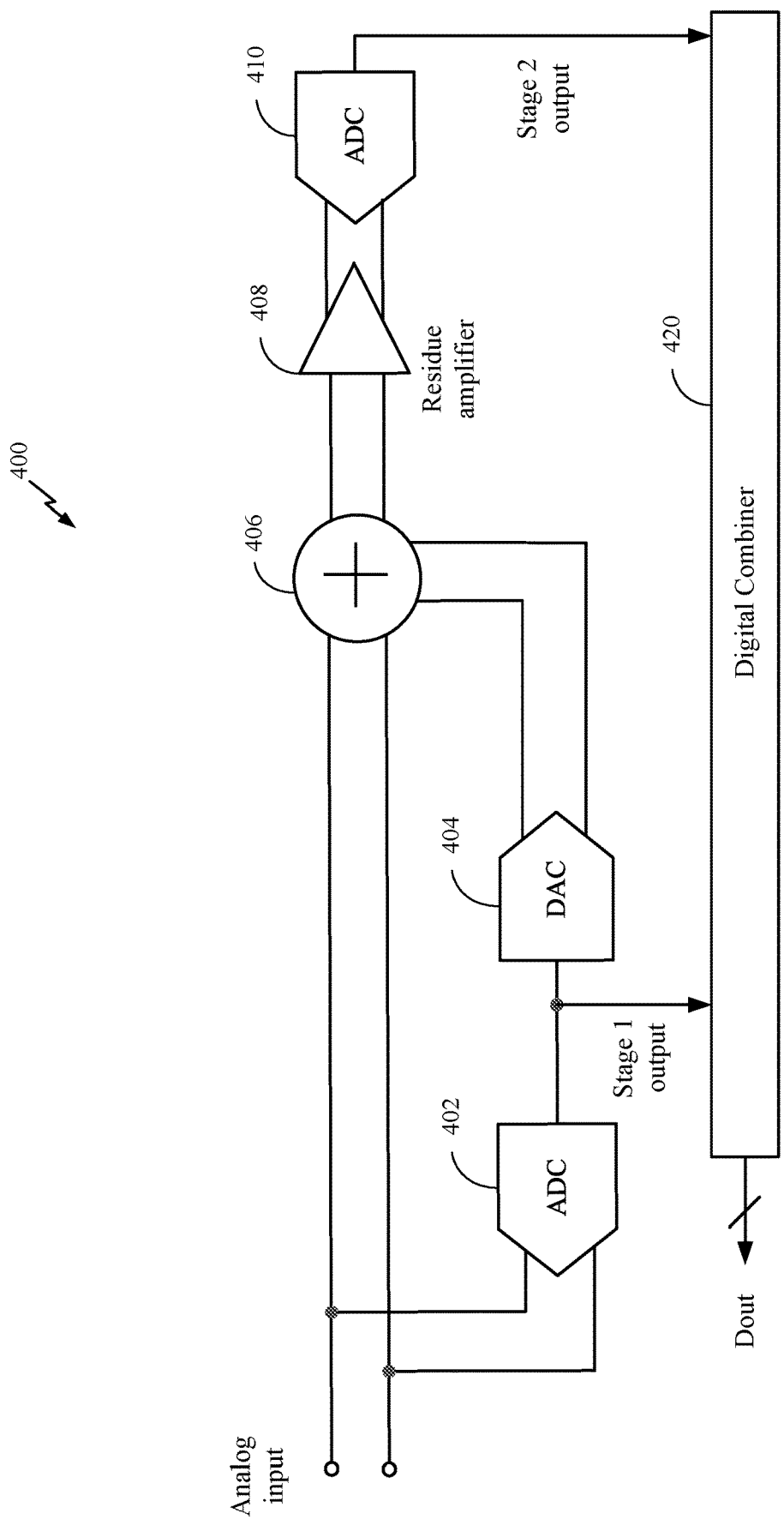
FIG. 4 is a block diagram of an example pipelined analog-to-digital converter (ADC), in which aspects of the present disclosure may be practiced.

FIG. 4 illustrates an example pipelined ADC 400. The pipelined ADC 400 includes at least an ADC 402 (e.g., a first ADC), a digital-to-analog converter (DAC) 404, an analog combiner 406, a residue amplifier 408, and an ADC 410 (e.g., a second ADC). Although the pipelined ADC 400 includes a single stage for generating a digital output and a digital residue, the reader is to understand that the pipelined ADC may include more than one stage, where the analog residue from one stage is input as an analog input to the next stage. The pipelined ADC 400 may also include a digital combiner 420 for combining the output(s) of the one or more stages and the digital residue from the ADC 410 and generating the digital output (labeled "Dout"). Although illustrated as a differential pipelined ADC, the ADC 400 may alternatively be implemented as a single-ended pipelined ADC.

The ADC 402 has inputs coupled to a differential input pair (e.g., input nodes) and receives an analog input (e.g., a differential input voltage). The ADC 402 may be a relatively low-resolution ADC and may be implemented by a flash ADC or any other suitable type of ADC. The ADC 402 generates a digital output (e.g., a stage 1 output, which may be single-ended) based on the analog input. Having an input coupled to an output of the ADC 402, the DAC 404 receives the digital output of the ADC 402 as an input. The DAC 404 regenerates the received digital input from the ADC 402 into an analog voltage (a differential voltage) on another differential pair.

The analog combiner 406 has first inputs coupled to the differential input pair and to the differential outputs of the DAC 404. The analog combiner 406 determines a residual voltage (also referred to as the "residue") based on a difference between the analog input and the analog voltage from the DAC 404. The residue amplifier 408 has inputs coupled to outputs of the analog combiner 406 and is configured to receive the residual voltage as an input from the analog combiner 406. For certain aspects, the residue amplifier 408 may be implemented as a dynamic amplifier circuit (with a dynamic amplifier and a fixed or dynamic current source), as described below. The residue amplifier 408 amplifies the residual voltage according to a gain of the residue amplifier. The ADC 410 has inputs coupled to outputs of the residue amplifier 408 and receives the output voltage from the residue amplifier 408 as an input. The ADC 410 may be implemented as a successive-approximation register (SAR) ADC, a flash ADC, or any other suitable type of ADC. The ADC 410 generates a digital output (e.g., the residue, but labeled here as a stage 2 output) based on the received output voltage from the residue amplifier 408.

While the residue amplifier 408 is important to the performance of the pipelined ADC, some implementations of the residue amplifier 408 may use a substantial amount of power for amplifying the residual voltage. Dynamic amplifiers are relatively very power efficient, and therefore, a dynamic amplifier may be utilized as the residue amplifier 408 in the pipelined ADC 400.

Figure 5:
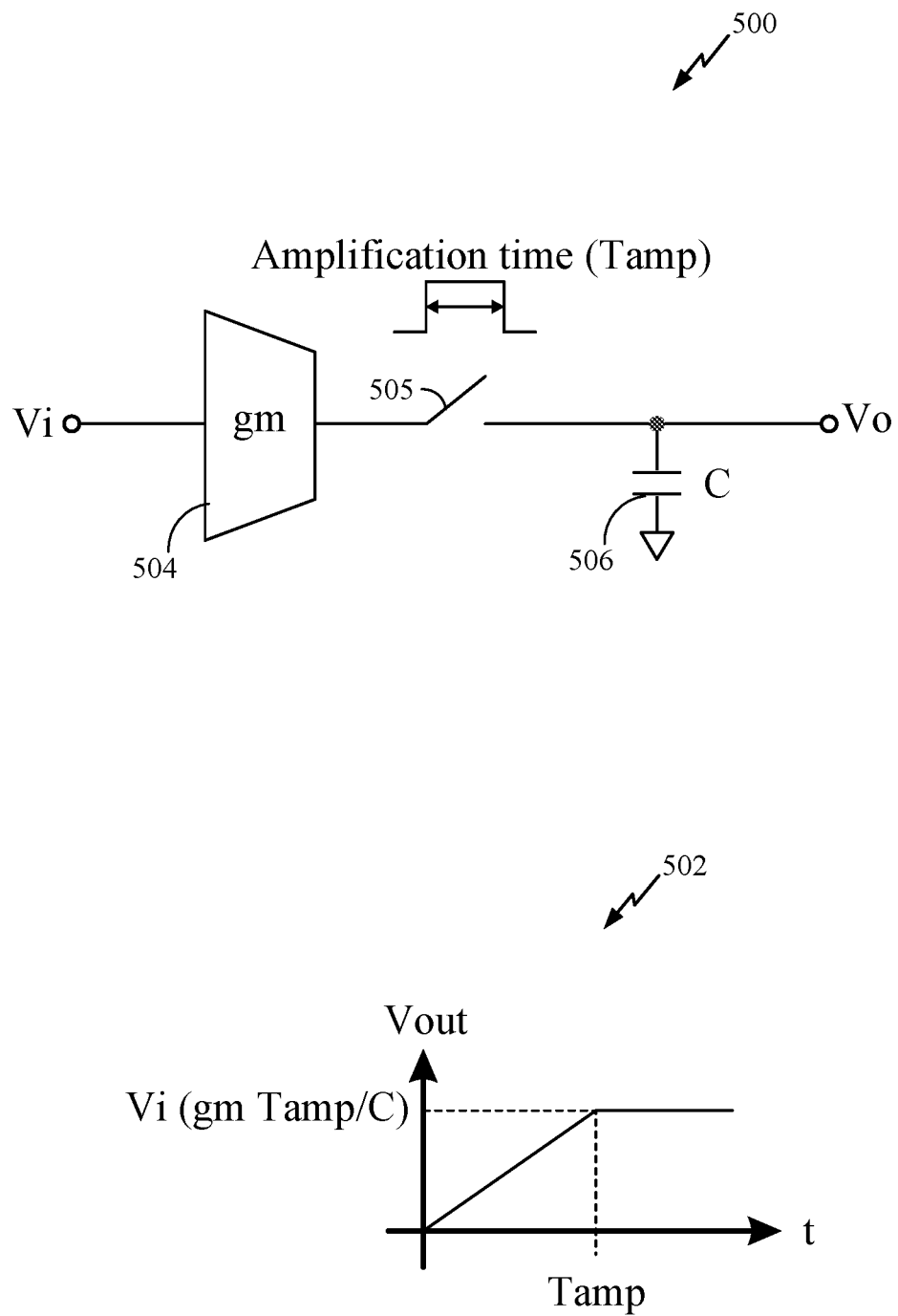
FIG. 5 includes a block diagram of, and a timing diagram for, an example dynamic amplifier.

FIG. 5 includes a block diagram of an example dynamic amplifier 500, which may be used as a residue amplifier (e.g., residue amplifier 408) in a pipelined ADC. FIG. 5 also includes a timing diagram 502 for the dynamic amplifier 500. The dynamic amplifier 500 is a single-ended implementation, but it is to be understood that the dynamic amplifier may alternatively be implemented differentially.

As illustrated in FIG. 5, the dynamic amplifier 500 includes a transconductance ($g_m$) stage 504, a switch 505, and a capacitive element 506 having a capacitance C. An input voltage (labeled "Vi") may be provided to the $g_m$ stage 504, which performs voltage-to-current conversion on the input voltage. When the switch 505 is closed, the output current from the $g_m$ stage 504 is applied to the capacitive element 506 to generate an output voltage (labeled "Vo") for the dynamic amplifier 500.

As illustrated in the timing diagram 502, the output voltage initially starts at 0 V before the capacitor is charged. When the switch 505 is initially closed at time t=0, the output current from the $g_m$ stage 504 begins charging the capacitive element 506 and ramping up the output voltage. After a fixed amount of time (e.g., amplification time (Tamp), also referred to as the "integration time"), the current being applied to the capacitive element 506 is stopped (e.g., the switch 505 is opened), and the output voltage of the dynamic amplifier 500 equals Vi (gm Tamp/C). Therefore, a longer amplification time is used to achieve a higher gain (=gm Tamp/C) for the dynamic amplifier 500.

Figure 6:
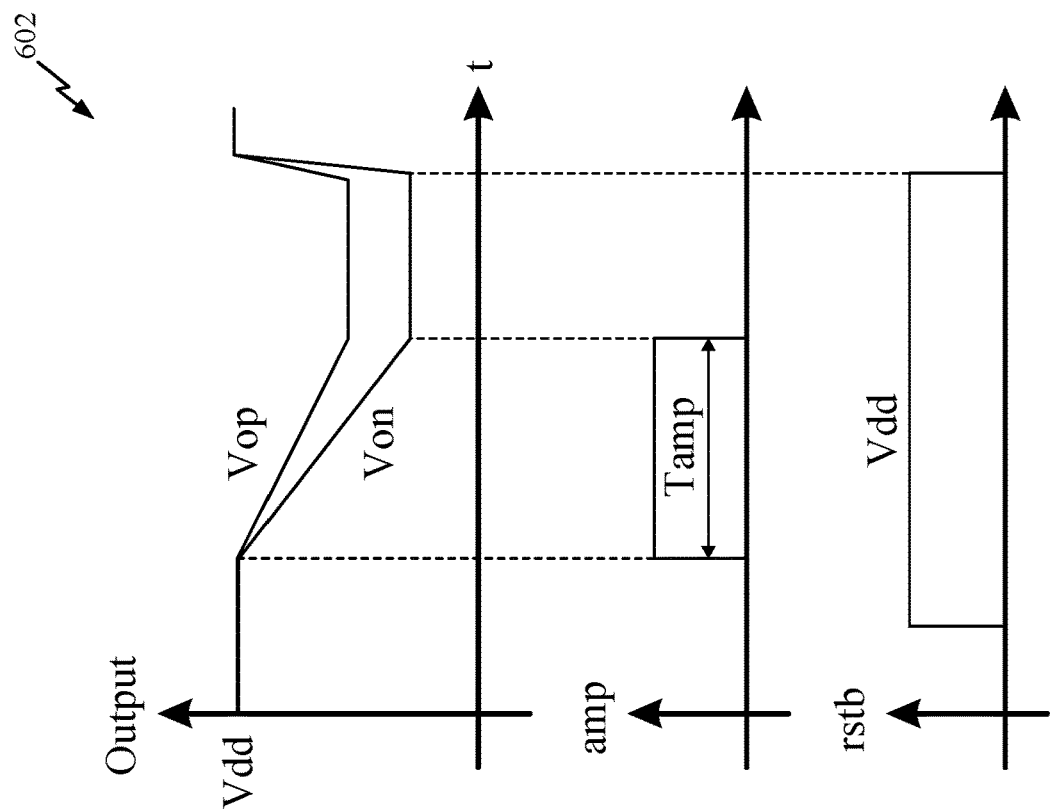
FIG. 6 includes a schematic of, and a timing diagram for, an example dynamic amplifier.
Figure 6:
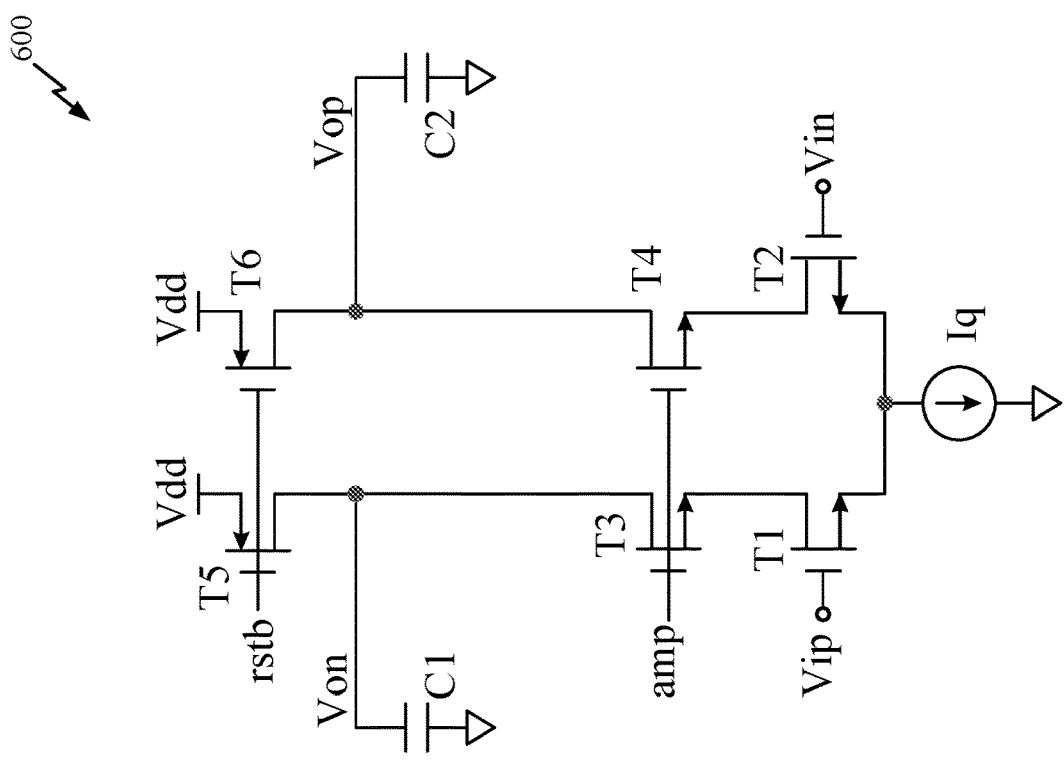

FIG. 6 includes a schematic of example circuitry for an example dynamic amplifier 600. FIG. 6 also includes a timing diagram 602 for the dynamic amplifier 600.

The dynamic amplifier 600 is a differential circuit that receives a differential input pair (labeled "Vip" for positive input voltage and "Vin" for negative input voltage) received at corresponding differential input nodes and amplifies the differential input pair according to the amplification time (Tamp) to generate a differential output pair (labeled "Vop" for positive output voltage and "Von" for negative output voltage) at corresponding differential output nodes. The dynamic amplifier further includes a set of capacitive elements. The set of capacitive elements includes a first capacitive element C1 and a second capacitive element C2. The capacitive elements C1 and C2 are coupled to the differential output nodes Von and Vop as shunt capacitive elements. For example, the first capacitive element C1 is coupled between the first differential output node Von and a reference potential node (e.g., electrical ground) for the dynamic amplifier 600, and the second capacitive element C2 is coupled between the second differential output node Vop and the reference potential node.

The dynamic amplifier 600 further includes multiple transistors and a quiescent current source (labeled "Iq"). The multiple transistors include a first pair of transistors, a second pair of transistors, and a third pair of transistors.

The first pair of transistors includes a first transistor T1 and a second transistor T2, which may be implemented as n-type field-effect transistors (NFETs), as shown in FIG. 6, and may be considered as transconductance elements because an input voltage is used to control an output current. The first pair of transistors have control inputs (e.g., gates) coupled to the differential input nodes of the dynamic amplifier 600. For example, a control input of the first transistor T1 is coupled to the first differential input node Vip, and a control input of the second transistor T2 is coupled to the second differential input node Vin. The first pair of transistors may be coupled to the quiescent current source Iq, as shown.

The second pair of transistors includes a third transistor T3 and a fourth transistor T4, which may be implemented as NFETs, as illustrated in FIG. 6. The second pair of transistors are coupled between the first pair of transistors and the differential output nodes of the dynamic amplifier 600. For example, the third transistor T3 has a source coupled to a drain of the first transistor T1 and has a drain coupled to the first differential output node Von, and the fourth transistor T4 has a source coupled to a drain of the second transistor T2 and has a drain coupled to the second differential output node Vop. The control inputs (e.g., the gates) of the second pair of transistors may be coupled to an amplification control node receiving a control signal (labeled "amp") for controlling the amplification time (Tamp) of the dynamic amplifier.

For certain aspects, the second pair of transistors is optional and may be removed from the dynamic amplifier 600. In this case, the third pair of transistors may be coupled to the first pair of transistors.

The third pair of transistors includes a fifth transistor T5 and a sixth transistor T6, which may be implemented as p-type field-effect transistors (PFETs), as depicted in FIG. 6. The third pair of transistors are coupled to the second pair of transistors and the differential output nodes of the dynamic amplifier 600. For example, the fifth transistor T5 has a drain coupled to the drain of the third transistor T3 and to the first differential output node Von. Also, the sixth transistor T6 has a drain coupled to the drain of the fourth transistor T4 and to the second differential output node Vop. Sources of the fifth transistor T5 and the sixth transistor T6 may be coupled to a power supply rail (labeled "Vdd") for the dynamic amplifier. The control inputs (e.g., the gates) of the third pair of transistors may be coupled to reset node configured to receive a complementary control signal (labeled "rstb") for resetting the dynamic amplifier when asserted (e.g., logic low).

In operation, as illustrated in the timing diagram 602, prior to amplification (e.g., beginning of amplification time (Tamp) of the dynamic amplifier), the first differential output Von and the second differential output Vop may have a voltage pulled up to the power supply voltage Vdd. Since both the first differential output Von and the second differential output Vop have the same voltage at this point, differentially the voltage value is zero, and the common-mode voltage is Vdd.

When rstb is deasserted (e.g., logic high) to end a reset phase of the dynamic amplifier, the fifth transistor T5 and the sixth transistor T6 are turned OFF. When the amp signal is asserted (e.g., goes from logic low to logic high), the third transistor T3 and the fourth transistor T4 are turned ON, and the first transistor T1 and the second transistor T2 may operate as a differential input amplifier stage to pull down current and begin discharging the first capacitive element C1 and the second capacitive element C2, respectively, thereby lowering the first differential output Von and the second differential output Vop.

Presuming the positive input voltage Vip is not equal to the negative input voltage Vin, one side of the dynamic amplifier 600 will pull down more current than the other side. In this case, both capacitive elements C1 and C2 are being discharged, but at different rates. For example, the positive input voltage Vip may be greater than the negative input voltage Vin, such that the first transistor T1 sinks more current from the first capacitive element C1 than the second transistor T2 sinks from the second capacitive element C2, causing the first output voltage Von to be lower than the second output voltage Von, as depicted in the timing diagram 602. When the amp signal is deasserted to end the amplification time (Tamp), the difference between the second output voltage Vop and the first output voltage Von (e.g., the differential output voltage) at the end of Tamp divided by the difference between the positive input voltage Vip and the negative input voltage Vin (e.g., the differential input voltage) represents the gain of the dynamic amplifier 600. The amplification time (Tamp) may be lengthened to increase the gain of the dynamic amplifier 600.

However, as Tamp is lengthened to increase the gain, the output common-mode voltage (Vcmo) of the dynamic amplifier 600 continues shifting (e.g., dropping). As used herein, a "common-mode voltage" generally refers to the voltage common to both nodes of a differential signal pair. Thus, Vcmo is the common-mode voltage between the differential output voltages Vop and Von (e.g., Vcmo may equal half the sum of Vop and Von). At some point as Tamp is lengthened, the transistors (e.g., the first transistor T1 and the second transistor T2) may leave the saturation region and enter the triode region, and the output voltages Vop and Von may both drop to 0 V, in which case the gain of the dynamic amplifier 600 drops to 0. This may lead to non-monotonic behavior in the dynamic amplifier. This non-monotonicity may break any feedback control loops, which can result in a catastrophic failure.

A person having ordinary skill in the art of electronics will understand that the dynamic amplifier 600 of FIG. 6 may be implemented with opposite type transistors and logic, such that transistors T1-T4 could be PFETs and transistors T5 and T6 could be NFETs. In this case, the output common-mode voltage would be pulled up from ground, rather than pulled down from the power supply rail. For ease of explanation and to aid understanding, the disclosure below may refer only to the output common-mode voltage dropping, but the reader is to understand that alternative implementations of the dynamic amplifier may involve the output common-mode voltage rising and that a shift may mean either a rise or a fall.

To prevent the output common-mode voltage (Vcmo) of the dynamic amplifier 600 from falling too far, one or more straightforward approaches could be taken. In one approach, the power supply rail voltage Vdd may be increased, which would raise Vcmo for a given Tamp. In other words, by increasing Vdd, Tamp can be increased (before the dynamic amplifier 600 runs into the problem noted above). However, raising Vdd leads to increased power consumption of the dynamic amplifier 600. In another example approach, the transconductance ($g_m$) of the first and second transistors T1 and T2 may be increased. An increased $g_m$ may allow for reduced amplification time to achieve the same gain. However, when the $g_m$ is increased, the power consumption of the dynamic amplifier 600 may also be increased, due to the increased current, and/or the non-linearity of the dynamic amplifier may increase. In yet another example approach, Tamp may be reduced. However, reducing Tamp decreases the gain of the dynamic amplifier 600, which may degrade performance of a pipelined ADC or other circuit with the dynamic amplifier.

Example Output Common-Mode Control for Dynamic Amplifiers

Aspects of the present disclosure describe an amplifier circuit having a dynamic amplifier and a current source selectively applied to differential outputs of the dynamic amplifier. The current source may be selectively coupled to the differential outputs of the dynamic amplifier in some cases, or the current source may be coupled to the differential outputs, but selectively enabled. The current source may be a fixed current source or a dynamic current source, the latter of which may be adjusted in a feedback loop based on sensing the common-mode output of the dynamic amplifier. The application of a common-mode counter current from the current source to the differential outputs of the dynamic amplifier may control (e.g., reduce) a common-mode voltage shift (e.g., drop) at the differential outputs during amplification. By controlling the output common-mode voltage, the maximum achievable gain of the dynamic amplifier can be increased, which may enhance the performance of ADCs and other circuits employing such a dynamic amplifier.

Figure 7:
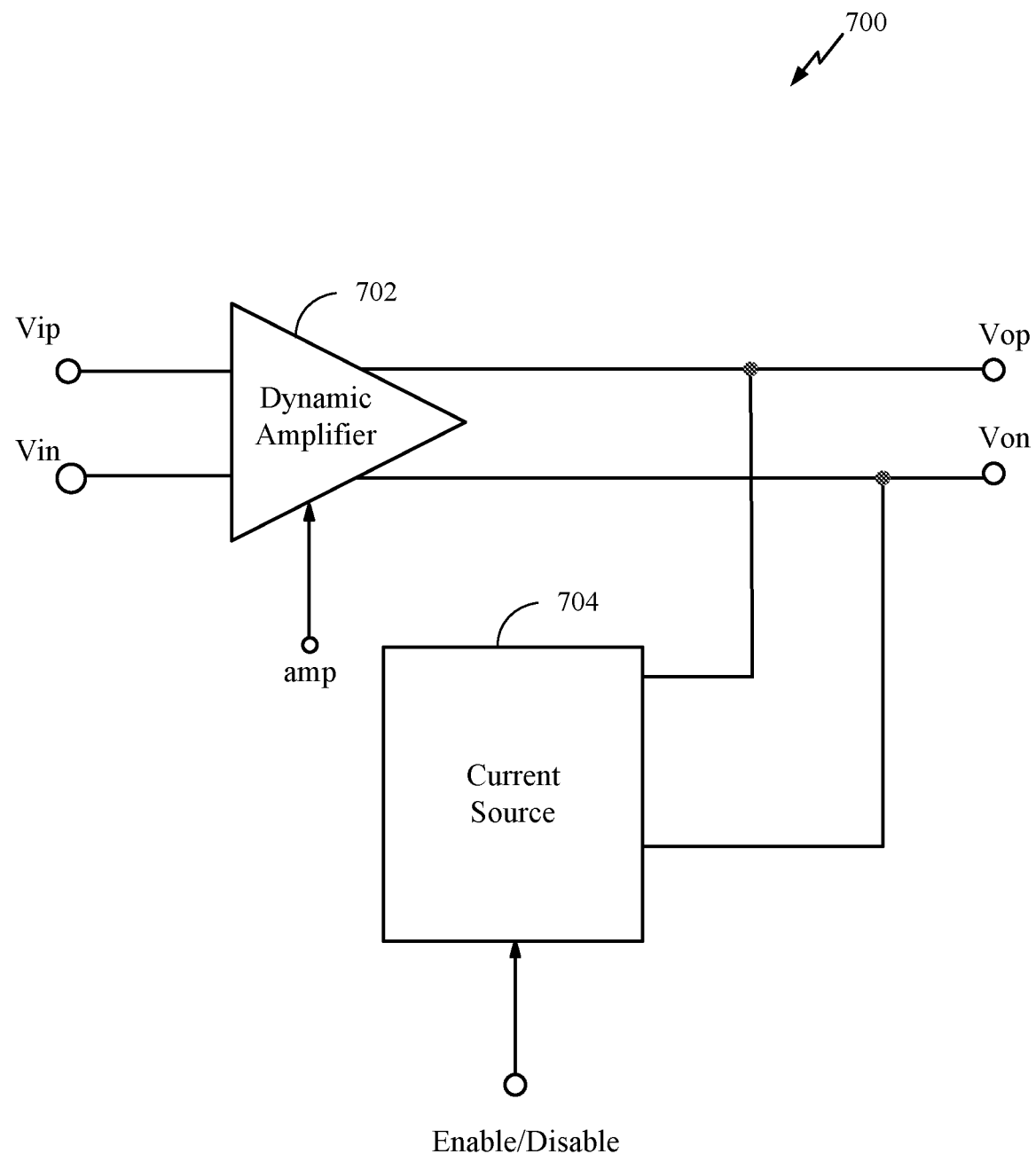
FIG. 7 is a block diagram of an example amplifier circuit having a dynamic amplifier and a fixed current source, in accordance with certain aspects of the present disclosure.

FIG. 7 is a block diagram of an example amplifier circuit 700 having a dynamic amplifier 702 with a current source 704 (e.g., a fixed current source), in accordance with certain aspects of the present disclosure. As illustrated, the dynamic amplifier 702 includes differential inputs (such as Vip and Vin nodes or terminals) and differential outputs (such as Von and Vop nodes or terminals). The current source 704 may include a plurality of capacitive elements or may be coupled to the capacitive elements. The capacitive elements may be used to split an output current from the current source 704 into multiple paths (e.g., two paths for the differential outputs Von and Vop). The current source 704 is selectively applied to the differential outputs of the dynamic amplifier 702. For example, when the current source 704 is enabled using a control signal (labeled "Enable/Disable"), the current source 704 generates output currents (e.g., fixed counter common-mode currents) that are applied to the differential outputs of the dynamic amplifier 702 (e.g., at least during a portion of a time length of amplification, as controlled by the amplification signal (labeled "amp")). The application of the output current to the differential outputs of the dynamic amplifier 702, during the amplification time (Tamp), reduces a common-mode voltage shift at the differential outputs of the dynamic amplifier 702.

Figure 8:
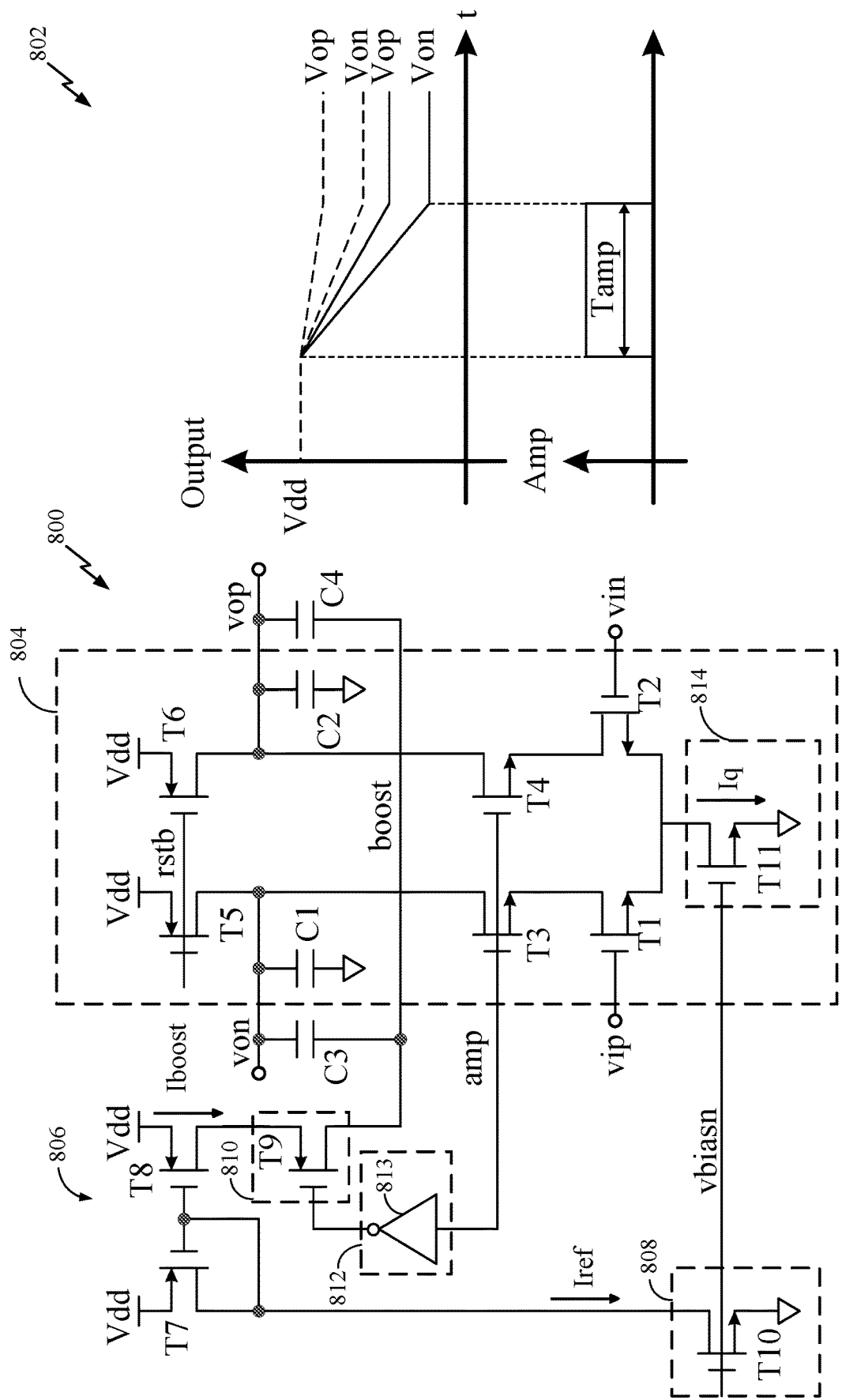
FIG. 8 is a schematic of, and a timing diagram for, an example implementation of the amplifier circuit of FIG. 7, in accordance with certain aspects of the present disclosure.

FIG. 8 includes a schematic of example circuitry 800 and a timing diagram 802 for an example implementation of the amplifier circuit 700 of FIG. 7, in accordance with certain aspects of the present disclosure. The example circuitry 800 includes a dynamic amplifier 804 and a current source (e.g., a fixed counter common-mode current source)—implemented by a current mirror 806 with a reference current source 808—to reduce a common-mode voltage shift (e.g., drop) during amplification. As used herein, a "counter common-mode current" generally refers to a current that is actually less than (e.g., at most 95% or at most 90% of) the combined current drawn from the capacitive element C1 and from the capacitive element C2 during amplification by the dynamic amplifier.

The dynamic amplifier 804 is similar to the dynamic amplifier 600 of FIG. 6. The dynamic amplifier 804 of FIG. 8 illustrates an example implementation for the quiescent current source. In the quiescent current source 814, a transistor T11 may be used to control the quiescent current Iq for the dynamic amplifier 804. As shown, transistor T11 may be an NFET, a drain of transistor T11 may be coupled to the sources of the first transistor T1 and the second transistor T2, and a source of transistor T11 may be coupled to the reference potential node (e.g., electrical ground) for the dynamic amplifier 804. A control input of the quiescent current source 814 (e.g., a gate of transistor T11) is coupled to a control input of the reference current source 808, and both control inputs may receive a bias control signal (labeled "vbiasn"). Similar to the quiescent current source 814, the reference current source 808 may be implemented by a transistor T10. As shown, transistor T10 may be an NFET, a source of transistor T10 may be coupled to the reference potential node, and a drain of transistor T10 may be coupled to the current mirror 806 (and more specifically to a first branch of the current mirror). Transistors T10 and T11 may have a similar size, such that the reference current Tref is similar to the quiescent current Iq.

The current source is configured to generate an output current Iboost (e.g., a fixed counter common-mode current), portions of which are selectively applied to the first differential output Von and the second differential output Vop, during amplification, to reduce the common-mode voltage drop at the first differential output Von and the second differential output Vop. The current mirror 806 has a first branch and a second branch. The first branch of the current mirror 806 includes the reference current source 808 and a seventh transistor T7, which may be implemented as a PFET having a drain coupled to the reference current source 808 and to the gate of the seventh transistor T7. The source of the seventh transistor T7 is coupled to the power supply rail Vdd. The second branch of the current mirror 806 includes an eighth transistor T8. As shown, the eighth transistor T8 may be implemented as a PFET having a gate coupled to the gate and the drain of the seventh transistor T7 and having a source coupled to the power supply rail Vdd. The drain of the eighth transistor T8 may serve as the output of the current mirror 806 for sourcing the output current Iboost.

The size ratio of the seventh transistor T7 to the eighth transistor T8, and the size ratio of the tenth transistor T10 to the eleventh transistor T11 may both be used to control the current ratio between the output current Iboost and the quiescent current Iq. For certain aspects, the size ratio of the seventh transistor T7 to the eighth transistor T8, and the size ratio of the tenth transistor T10 to the eleventh transistor T11 may be such that the output current Iboost is smaller than the quiescent current Iq (e.g., Iboost≤0.9*Iq). By having the output current Iboost be smaller than the quiescent current Iq, the output current Iboost may not completely counteract the current drawn from the first and second capacitive elements C1 and C2 during the amplification time (Tamp), thereby allowing for some voltage drop in the first differential output Von and the second differential output Vop (and hence, some drop in the output common-mode voltage (Vcmo)), but a smaller voltage drop than in conventional dynamic amplifiers.

In certain aspects, the second branch of the current mirror 806 is coupled to the differential outputs of the dynamic amplifier 804 via a second set of capacitive elements. The second set of capacitive elements includes a third capacitive element C3 and a fourth capacitive element C4. For example, the drain of the eighth transistor T8 may be selectively coupled to the first differential output Von and the second differential output Vop via the third capacitive element C3 and the fourth capacitive element C4, respectively.

The circuitry 800 further includes a switch 810. The switch 810 is coupled between the second branch of the current mirror 806 and the second set of capacitive elements. For certain aspects, the switch 810 may be implemented by a ninth transistor T9. As illustrated in FIG. 8, the ninth transistor T9 may be a PFET having a source coupled to the output of the second branch of the current mirror 806 (e.g., to the drain of the eighth transistor T8) and having a drain coupled to a boost node. The third capacitive element C3 is coupled between the boost node and the first differential output node Von, and the fourth capacitive element C4 is coupled between the boost node and the second differential output node Vop.

The circuitry 800 further includes control logic 812 having an input and an output. The output of the control logic 812 is coupled to a control input of the switch 810 (e.g., to a gate of the ninth transistor T9). In this manner, the control logic 812 is configured to control the switch 810, thereby controlling whether the output current Iboost (e.g., the fixed counter common-mode current) is applied to the dynamic amplifier 804. When the switch 810 is closed (e.g., during amplification by the dynamic amplifier 804), the output current Iboost from the current mirror 806 can be applied to the first differential output node Von and to the second differential output node Vop.

For certain aspects, the control logic 812 may be implemented as a logic inverter 813, as illustrated in FIG. 8. In this case, the control input of the dynamic amplifier 804 (for carrying the amp signal) may be coupled to the input of the control logic 812 (e.g., to the input of the inverter 813). In this manner, when the amp signal is asserted (e.g., by changing from logic low to logic high), the inverter 813 inverts the amp signal, which is logic low at the gate of the ninth transistor T9, thereby turning on the ninth transistor T9 and allowing the output current Iboost to flow to the boost node.

During the amplification time (Tamp) of the dynamic amplifier 804, as explained above, current is drawn from the first and second capacitive elements C1 and C2, thereby lowering the first differential output Von and the second differential output Vop. With the fixed counter common-mode current supplied by the current source during amplification (e.g., while the amp signal is asserted for Tamp), a portion of the output current Iboost is applied to the first differential output Von through the third capacitive element C3, and another portion of the output current Iboost is applied to the second differential output Vop through the fourth capacitive element C4. Therefore, while the differential output voltages are ramping down, the boost voltage is ramping up due to the counter common-mode current (Iboost), thereby effectively slowing the rate of discharge from the capacitive elements C1 and C2 and decreasing the amount of common-mode voltage shift (e.g., drop).

As illustrated in the timing diagram 802, during an amplification pulse of the amp signal having a duration of Tamp, when there is no output current Iboost applied to the first differential output Von and the second differential output Vop (as in the case of the dynamic amplifier 600), values of the first differential output Von and the second differential output Vop (shown in solid lines) drop sharply. However, when the output current Iboost is applied to the first differential output Von and the second differential output Vop (as in the case of the circuitry 800), values of the first differential output Von and the second differential output Vop (shown in dashed lines) are still dropped, but more gradually and to a lesser degree (since the application of the output current partly counteracts the common-mode voltage drop). In other words, the average value (Vcmo) between the differential outputs Vop and Von falls at a slower rate when the output current Iboost is applied. Accordingly, the application of the fixed counter common-mode current (Iboost) may allow for a longer amplification time (Tamp) and, thus, a higher gain for the dynamic amplifier 804. This increase in gain comes without increasing the power supply voltage Vdd or increasing the transconductance of the transistors T1 and T2. In addition, the difference between the values of the first differential output Von and the second differential output Vop is the same, regardless whether the counter common-mode current (Iboost) is applied, and thus, the gain of the dynamic amplifier is unaffected for the same Tamp, as shown in the timing diagram 802.

Figure 9:
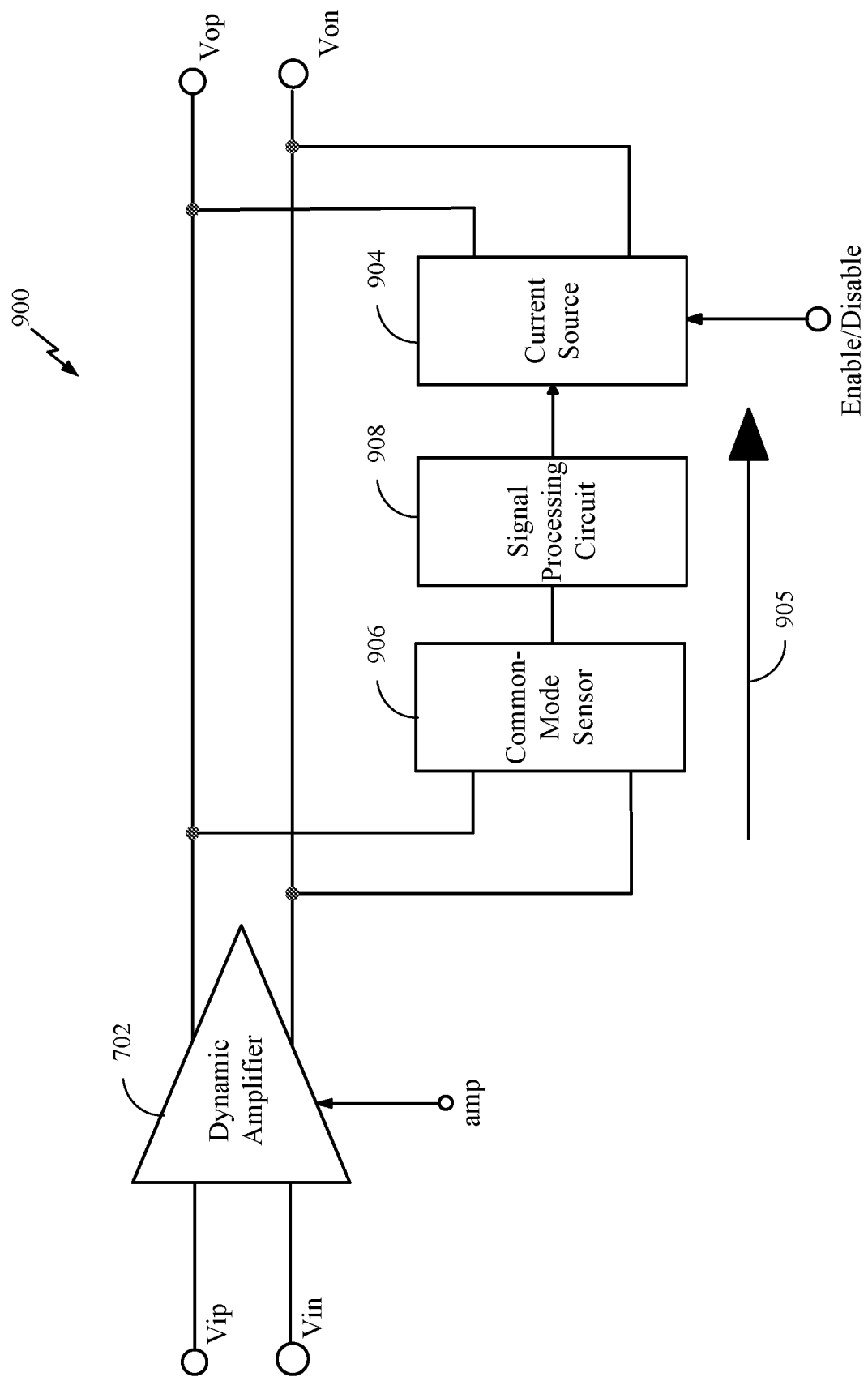
FIG. 9 is a block diagram of an example amplifier circuit having a dynamic amplifier and a dynamic current source, which is tunable based on a sensed common-mode voltage at the output of the dynamic amplifier, in accordance with certain aspects of the present disclosure.

FIG. 9 is a block diagram of an example amplifier circuit 900 having a dynamic amplifier 702 and a current source 904 (e.g., a dynamic/tunable/adjustable current source), in accordance with certain aspects of the present disclosure.

The amplifier circuit 900 further includes a feedback path 905 coupled between the differential outputs of the dynamic amplifier 702 and a control input of the current source 904, which is controlled to inject counter common-mode current back into the differential outputs. The current source 904 is adjusted based on a sensed output common-mode voltage (Vcmo) between the differential outputs of the dynamic amplifier 702. As such, the feedback path 905 includes a common-mode sensor 906 and, in some cases, a signal processing circuit 908. In certain aspects, the common-mode sensor 906 includes multiple inputs and an output. The inputs of the common-mode sensor 906 are coupled to the differential output nodes Vop and Von of the dynamic amplifier 702. In certain aspects, the signal processing circuit 908 includes an input and an output. The input of the signal processing circuit 908 is coupled to the output of the common-mode sensor 906. The output of the signal processing circuit 908 may serve as the control input to the current source 904 for tuning the output current.

In operation, the common-mode sensor 906 may sense the differential outputs Vop and Von of the dynamic amplifier 702 and determine the output common-mode voltage of the dynamic amplifier. For certain aspects, the signal processing circuit 908 may perform signal processing (e.g., comparing to a reference voltage, amplifying, and/or filtering) on the output common-mode voltage, and the processed signal may be provided as a control input to the current source 904.

The current source 904 may include a plurality of capacitive elements or may be coupled to the capacitive elements. The capacitive elements may be used to split an output current from the current source 904 into multiple paths (e.g., two paths for the differential outputs Von and Vop). The current source 904 may be selectively applied to the differential outputs of the dynamic amplifier 702. For example, when the current source 904 is enabled using a control signal (labeled "Enable/Disable"), the current source 904 generates output currents that are applied to the differential outputs of the dynamic amplifier 702 (e.g., at least during a portion of a time length of amplification, as controlled by the amplification signal (labeled "amp")). The output currents may be dynamic counter common-mode currents based on the sensed common-mode voltage indicated via the feedback path 905 to achieve a desired common-mode voltage at the differential outputs of the dynamic amplifier 702. The application of the output currents to the differential outputs of the dynamic amplifier 702, during the amplification time (Tamp), reduces a common-mode voltage shift (e.g., drop or rise) at the differential outputs of the dynamic amplifier 702 and achieves the desired output common-mode voltage.

Figure 10:
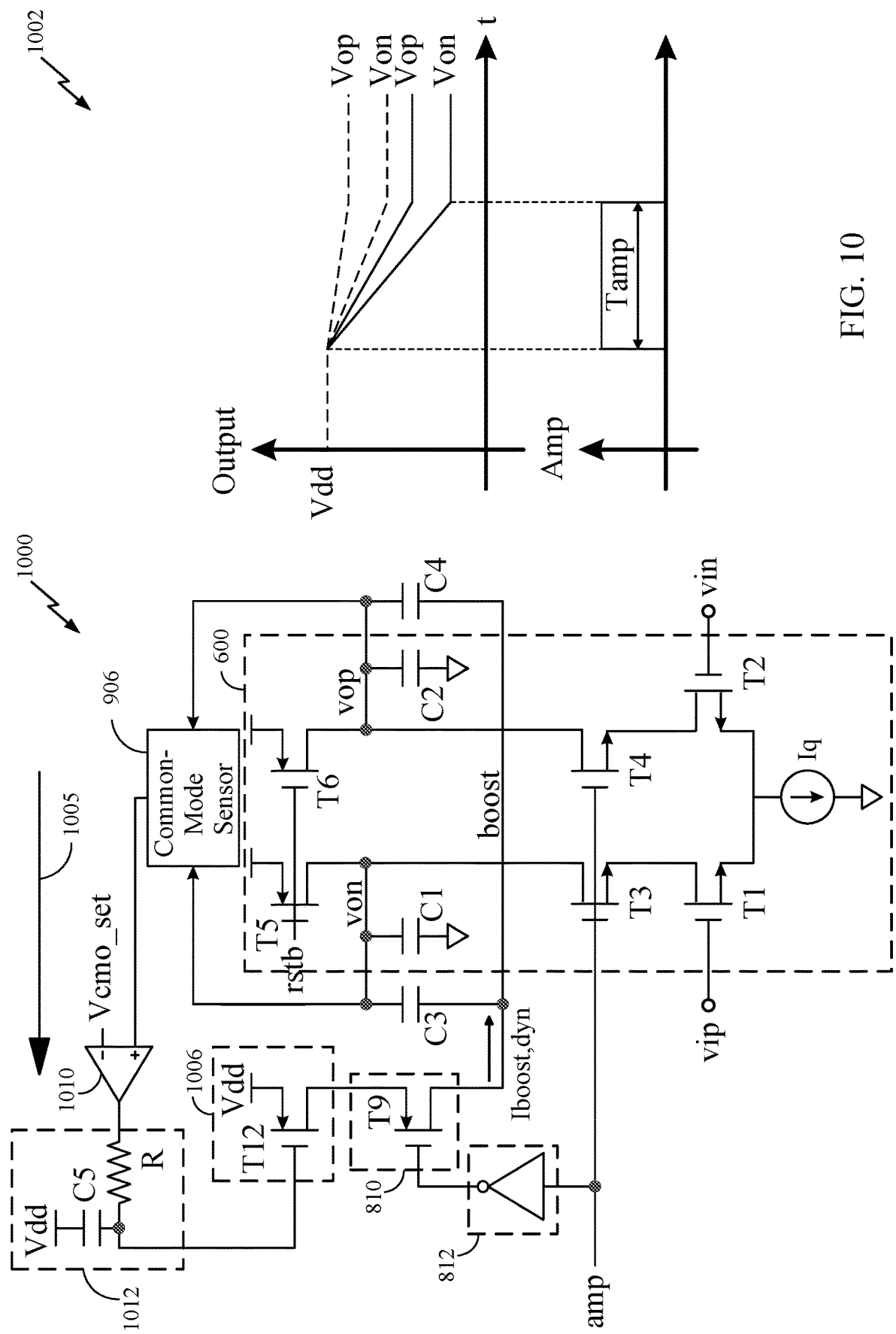
FIG. 10 is a schematic of, and a timing diagram for, an example implementation of the amplifier circuit of FIG. 9, in accordance with certain aspects of the present disclosure.

FIG. 10 includes a schematic of example circuitry 1000 and a timing diagram 1002 for an example implementation of the amplifier circuit 900 of FIG. 7, in accordance with certain aspects of the present disclosure. The example circuitry 1000 includes the dynamic amplifier 600 (or the dynamic amplifier 804), a current source 1006 (e.g., a dynamic counter common-mode current source), and a feedback path 1005 to reduce a common-mode voltage shift (e.g., drop) during amplification by the dynamic amplifier.

The current source 1006 is configured to generate an output current Iboost,dyn (e.g., a dynamic counter common-mode current), portions of which are selectively applied to the first differential output Von and the second differential output Vop, during amplification, to reduce the common-mode voltage drop at the first differential output Von and the second differential output Vop. The current source 1006 may be implemented by a transistor T12, which may be a PFET having a source coupled to a power supply voltage rail (e.g., Vdd) and having a drain (selectively) coupled to the boost node. The control input for the current source 1006 (e.g., the gate of transistor T12) may be coupled to the feedback path 1005. In this manner, the output current Iboost,dyn from the current source 1006 may be adjusted based on feedback from devices in the feedback path 1005.

The output current Iboost,dyn may be controlled to be smaller than the quiescent current Iq. By having the output current Iboost be smaller than the quiescent current Iq, the output current Iboost,dyn may not completely counteract the current drawn from the first and second capacitive elements C1 and C2 during the amplification time (Tamp), thereby allowing for some voltage drop in the first differential output Von and the second differential output Vop (and hence, some drop in the output common-mode voltage (Vcmo)), but a smaller voltage drop than in conventional dynamic amplifiers.

As described above, the feedback path 1005 is coupled between the differential outputs (e.g., the first differential output Von and the second differential output Vop) of the dynamic amplifier 600 and the control input of the current source 1006. The feedback path 1005 may include the common-mode sensor 906 and any of various suitable circuits for processing the sensed common-mode voltage from the common-mode sensor into a suitable control input for controlling the current source 1006. For example, as shown in FIG. 10, the feedback path 1005 includes an error amplifier 1010 and a low-pass filter 1012.

The common-mode sensor 906 may include or be implemented by a switched-capacitor circuit or any of various other suitable circuits capable of sensing a common-mode voltage between the differential outputs Von and Vop. As described above, the inputs of the common-mode sensor 906 may be coupled to the first differential output Von and the second differential output Vop. The output of the common-mode sensor 906 may be coupled to the error amplifier 1010. Thus, a value corresponding to the output common-mode voltage is sent to the error amplifier 1010.

In certain aspects, the error amplifier 1010 has a first input (e.g., a positive terminal), a second input (e.g., a negative terminal), and an output. The first input of the error amplifier 1010 may be coupled to the output of the common-mode sensor 906. The second input of the error amplifier 1010 may be coupled to a reference voltage node (labeled "Vcmo_set"), which may have a reference voltage generated by a reference voltage source or any of various other suitable components. In particular, the reference voltage may be an output common-mode voltage setpoint for the dynamic amplifier 600 during amplification. The output of the error amplifier 1010 is coupled to the control input of the current source 1006 (e.g., via the low-pass filter 1012). In this manner, the error amplifier 1010 may drive the current source 1006 (e.g., the gate of transistor T12) such that the common-mode voltage sensed by the common-mode sensor and fed to the first input of the error amplifier is maintained equal (at least within an offset voltage) to the common-mode setpoint (Vcmo_set) during amplification. The common-mode setpoint may be fixed (e.g., at 0.8*Vdd) or may be varied.

In certain aspects, the low-pass filter 1012 is coupled between the output of the error amplifier 1010 and the control input of the current source 1006. For example, the low-pass filter 1012 may be implemented by passive components, such as a series resistive element R and a capacitive element C5. The resistive element R may be coupled between the output of the error amplifier 1010 and the control input of the current source 1006, and the capacitive element C5 may be coupled between the control input of the current source 1006 and the power supply rail (Vdd). The low-pass filter 1012 may be designed to filter out higher frequency signals (e.g., transient signals from the switching operation of the switched-capacitor circuit implementing the common-mode sensor 906) and improve the stability of the circuitry 1000.

During the amplification time (Tamp) of the dynamic amplifier 600, as explained above, current is drawn from the first and second capacitive elements C1 and C2, thereby lowering the first differential output Von and the second differential output Vop. With the dynamic counter common-mode current supplied by the current source 1006 during amplification (e.g., while the amp signal is asserted for Tamp), a portion of the output current Iboost,dyn is applied to the first differential output Von through the third capacitive element C3, and another portion of the output current Iboost,dyn is applied to the second differential output Vop through the fourth capacitive element C4. Therefore, while the differential output voltages are ramping down, the boost voltage is ramping up due to the application of the dynamic counter common-mode current (Iboost,dyn), thereby effectively slowing the rate of discharge from the capacitive elements C1 and C2 and decreasing the amount of common-mode voltage shift (e.g., drop), nominally to the common-mode setpoint (Vcmo_set).

As illustrated in the timing diagram 1002, during an amplification time (Tamp) when the amp signal is asserted, when there is no output current Iboost,dyn applied to the first differential output Von and the second differential output Vop, values of the first differential output Von and the second differential output Vop (shown in solid lines) drop sharply. However, when the output current Iboost,dyn is applied to the first differential output Von and the second differential output Vop (as in the case of the circuitry 1000), values of the first differential output Von and the second differential output Vop (shown in dashed lines) are still dropped, but more gradually and to a lesser degree (since the application of the output current counteracts the common-mode voltage drop). In other words, the average value (Vcmo) between the differential outputs Vop and Von falls more slowly when the output current Iboost,dyn is applied. Accordingly, the application of the dynamic counter common-mode output current (Iboost,dyn) may permit a longer Tamp and, thus, a higher gain for the dynamic amplifier. This increase in gain comes without increasing the power supply voltage Vdd or increasing the transconductance of the transistors T1 and T2. Also, at the end of the amplification, the difference between the values of the first differential output Von and the second differential output Vop is the same, regardless whether the output current Iboost,dyn is applied, and thus, the gain of the dynamic amplifier is unaffected for the same amplification time (Tamp), as shown in the timing diagram 1002.

Figure 11:
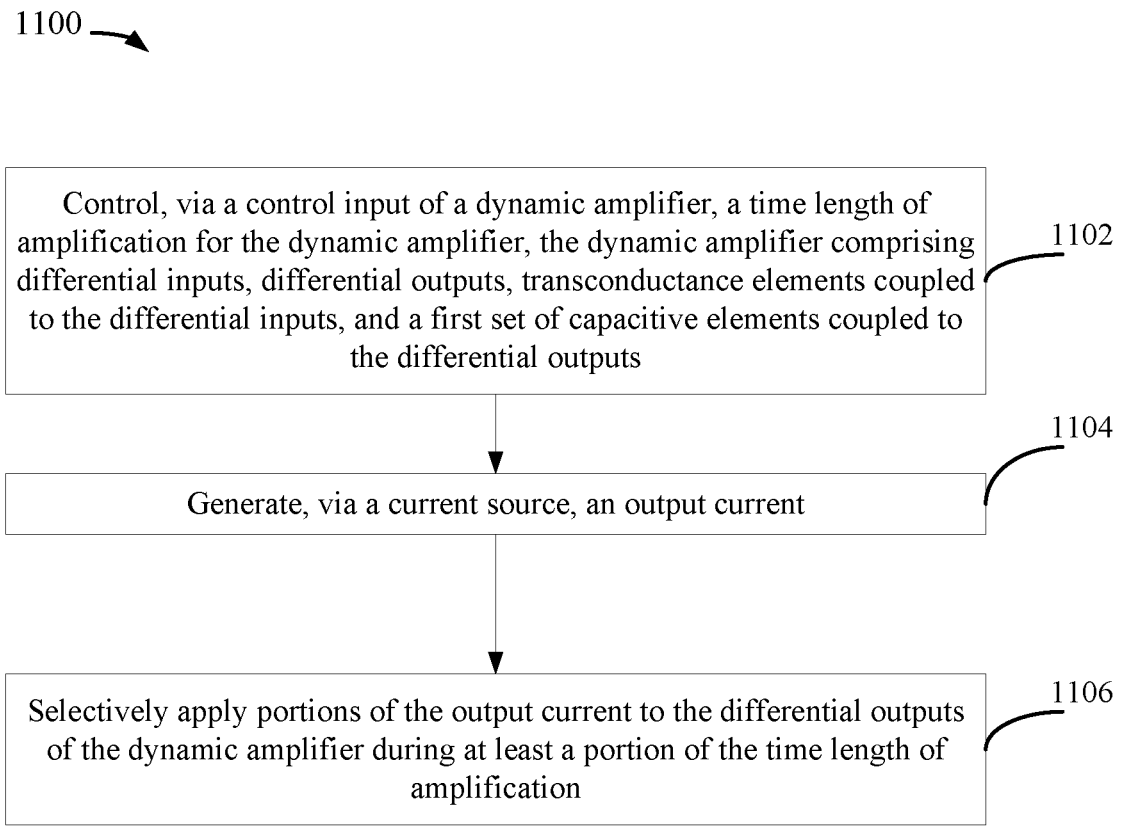
FIG. 11 is a flow diagram depicting example operations for signal amplification, in accordance with certain aspects of the present disclosure.

FIG. 11 is a flow diagram depicting example operations 1100 for signal amplification, in accordance with certain aspects of the present disclosure. For example, the operations 1100 may be performed by an amplifier circuit (e.g., amplifier circuit 700 or 900) having a dynamic amplifier (such as the dynamic amplifier 600 or 804) and a current source (such as the current source 1006 or the current mirror 806).

The operations 1100 may begin, at block 1102, by controlling, via a control input of the dynamic amplifier, a time length of amplification (e.g., Tamp) for the dynamic amplifier. The dynamic amplifier includes differential inputs (e.g., nodes Vip and Vin), differential outputs (e.g., nodes Vop and Von), transconductance elements (e.g., transistors T1 and T2) coupled to the differential inputs, and a first set of capacitive elements (e.g., capacitive elements C1 and C2) coupled to the differential outputs. At block 1104, the current source generates an output current (e.g., Iboost or Iboost, dyn). At block 1106, portions of the output current are selectively applied to the differential outputs of the dynamic amplifier during at least a portion of the time length of amplification.

In certain aspects, the current source is a dynamic current source. In other aspects, the current source is a fixed current source. In certain aspects, the portions of the output current are applied to the differential outputs of the dynamic amplifier to reduce common-mode voltage shift of the differential outputs during the at least the portion of the time length of amplification for the dynamic amplifier.

According to certain aspects, the operations 1100 further involve sensing a common-mode voltage of the differential outputs and determining a difference between the common-mode voltage and a setpoint. In this case, the generating at block 1104 may include controlling the current source based on the difference.

According to certain aspects, the selectively applying at block 1106 involves selectively coupling the current source to the differential outputs of the dynamic amplifier via a switch (e.g., the switch 810) coupled between the current source and a second set of capacitive elements (e.g., the capacitive elements C3 and C4) coupled to the differential outputs of the dynamic amplifier.

According to certain aspects, the generating at block 1104 involves generating a dynamic output current (e.g., Iboost, dyn).

In certain aspects, the dynamic amplifier described herein may be used in any circuit involving analog multiplication where the output is a capacitance (e.g., has a capacitive component), such as a switched-capacitor filter, a class-H audio amplifier, a delta-sigma converter, or a radio frequency (RF) mixer.

Example Pipelined Analog-to-Digital Converter Having a Dynamic Amplifier with Output Common-Mode Control Aspects of the present disclosure provide a pipelined analog-to-digital converter (ADC) (e.g., the pipelined ADC 400). The pipelined ADC may at least include a first converter stage, a second converter stage, and a first amplifier circuit (e.g., a residue amplifier 408).

In certain aspects, the first converter stage of the pipelined ADC includes one or more inputs. The first converter stage further includes a digital output and multiple differential residue outputs.

In certain aspects, the first amplifier circuit of the pipelined ADC includes multiple differential inputs. The multiple differential inputs of the first amplifier circuit are coupled to the multiple differential residue outputs of the first converter stage. In certain aspects, the first amplifier circuit further includes a dynamic amplifier (e.g., the dynamic amplifier 600 or 804) and a current source (e.g., the current source 1006 or the current mirror 806 and reference current source 808). The dynamic amplifier includes multiple differential inputs, multiple differential outputs, and a control input (e.g., with the amp signal). The multiple differential inputs of the dynamic amplifier are coupled to the multiple differential inputs of the first amplifier circuit. The control input is configured for controlling a time length of amplification (e.g., Tamp) for the dynamic amplifier. The current source is configured to generate an output current (e.g., Iboost or Iboost,dyn) such that portions of the output current are selectively applied to the differential outputs of the dynamic amplifier during at least a portion of the time length of amplification.

In certain aspects, the second converter stage of the pipelined ADC includes multiple differential inputs and a digital output. The multiple differential inputs of the second converter stage are coupled to multiple differential outputs of the first amplifier circuit. The second converter stage may include a successive-approximation ADC, for example.

In certain aspects, the first converter stage further includes a sub-ADC (e.g., the ADC 402), a digital-to-analog converter (DAC) (e.g., the DAC 404), and a combiner (e.g., the analog combiner 406). In certain aspects, the sub-ADC of the first converter stage includes differential inputs and an output. The differential inputs of the sub-ADC are coupled to the differential inputs of the first converter stage. The output of the sub-ADC is coupled to the digital output of the first converter stage. The sub-ADC may be a successive-approximation ADC, for example. In certain aspects, the DAC of the first converter stage includes differential inputs coupled to the differential outputs of the sub-ADC. In certain aspects, the combiner of the first converter stage includes first differential inputs, second differential inputs, and differential outputs. The first differential inputs of the combiner are coupled to the differential inputs of the first converter stage. The second differential inputs of the combiner are coupled to differential outputs of the DAC. The differential outputs of the combiner are coupled to the differential residue outputs of the first converter stage.

According to certain aspects, the pipelined ADC further includes a second amplifier circuit (e.g., the residue amplifier 408) and a third converter stage. In certain aspects, the second converter stage includes differential residue outputs. In certain aspects, the second amplifier circuit includes differential inputs coupled to the differential residue outputs of the second converter stage. In certain aspects, the third converter stage includes differential inputs and differential outputs. The differential outputs of the second amplifier circuit are coupled to the differential inputs of the third converter stage.

According to certain aspects, the second amplifier circuit of the pipelined ADC further includes another dynamic amplifier (e.g., the dynamic amplifier 600 or 804) and another current source (e.g., the current source 1006 or the current mirror 806 and reference current source 808). In certain aspects, the other dynamic amplifier includes differential inputs, differential outputs, and a control input (e.g., with the amp signal). The differential inputs of the other dynamic amplifier are coupled to the differential inputs of the second amplifier circuit. The control input of the other dynamic amplifier is configured to control another time length of amplification (e.g., Tamp) for the other dynamic amplifier. In certain aspects, the other current source is configured to generate another output current (e.g., Iboost or Iboost,dyn) such that portions of the other output current are selectively applied to the differential outputs of the other dynamic amplifier during at least a portion of the other time length of amplification.

According to certain aspects, the second converter stage of the pipelined ADC further includes a sub-ADC (e.g., the ADC 402), a DAC (e.g., the DAC 404), and a combiner (e.g., the analog combiner 406). In certain aspects, the sub-ADC of the second converter stage includes differential inputs and differential outputs. The differential inputs of the sub-ADC of the second converter stage are coupled to the differential inputs of the second converter stage. The differential outputs of the sub-ADC of the second converter stage are coupled to the digital output of the second converter stage. In certain aspects, the DAC of the second converter stage includes differential inputs coupled to the differential outputs of the sub-ADC. In certain aspects, the combiner of the second converter stage includes first differential inputs, second differential inputs, and differential outputs. The first differential inputs of the combiner of the second converter stage are coupled to the differential inputs of the second converter stage. The second differential inputs of the combiner of the second converter stage are coupled to differential outputs of the DAC. The differential outputs of the combiner of the second converter stage are coupled to the differential residue outputs of the second converter stage.

Example Aspects

Implementation examples are described in the following numbered aspects:

In a first aspect, an amplifier circuit comprising: a dynamic amplifier having differential inputs, differential outputs, transconductance elements coupled to the differential inputs, a first set of capacitive elements coupled to the differential outputs, and a control input for controlling a time length of amplification for the dynamic amplifier; and a current source configured to generate an output current such that portions of the output current are selectively applied to the differential outputs of the dynamic amplifier during at least a portion of the time length of amplification.

In a second aspect, alone or in combination with the first aspect, the current source is configured to apply the portions of the output current to the differential outputs of the dynamic amplifier to reduce a common-mode voltage shift of the differential outputs during the at least the portion of the time length of amplification for the dynamic amplifier.

In a third aspect, alone or in combination with one or more of the first and second aspects, the current source is selectively coupled to the differential outputs of the dynamic amplifier.

In a fourth aspect, alone or in combination with one or more of the first through third aspects, a feedback path coupled between the differential outputs of the dynamic amplifier and a control input of the current source.

In a fifth aspect, alone or in combination with one or more of the first through fourth aspects, the feedback path comprises a common-mode sensor having inputs coupled to the differential outputs of the dynamic amplifier.

In a sixth aspect, alone or in combination with one or more of the first through fifth aspects, the common-mode sensor comprises a switched-capacitor circuit.

In a seventh aspect, alone or in combination with one or more of the first through sixth aspects, the feedback path further comprises an error amplifier having a first input coupled to an output of the common-mode sensor, having a second input coupled to a reference voltage node, and having an output coupled to the control input of the current source.

In an eighth aspect, alone or in combination with one or more of the first through seventh aspects, the feedback path further comprises a low-pass filter coupled between the output of the error amplifier and the control input of the current source.

In a ninth aspect, alone or in combination with one or more of the first through eighth aspects, the feedback path further comprises a switch coupled between the current source and a second set of capacitive elements coupled to the differential outputs of the dynamic amplifier.

In a tenth aspect, alone or in combination with one or more of the first through ninth aspects, an inverter, wherein the control input of the dynamic amplifier is coupled to an input of the inverter and wherein an output of the inverter is coupled to a control input of the switch.

In an eleventh aspect, alone or in combination with one or more of the first through tenth aspects, the current source comprises a current mirror having a first branch with a reference current source and having a second branch coupled to the differential outputs of the dynamic amplifier via a second set of capacitive elements.

In a twelfth aspect, alone or in combination with one or more of the first through eleventh aspects, a switch coupled between the second branch of the current mirror and the second set of capacitive elements.

In a thirteenth aspect, alone or in combination with one or more of the first through twelfth aspects, an inverter, the control input of the dynamic amplifier is coupled to an input of the inverter and wherein an output of the inverter is coupled to a control input of the switch.

In a fourteenth aspect, alone or in combination with one or more of the first through thirteenth aspects, the dynamic amplifier further comprises a quiescent current source and wherein a control input of the quiescent current source is coupled to a control input of the reference current source.

In a fifteenth aspect, alone or in combination with one or more of the first through fourteenth aspects, the first branch of the current mirror comprises a first transistor coupled to the reference current source, wherein the second branch of the current mirror comprises a second transistor, wherein the quiescent current source comprises a third transistor, and wherein the reference current source and the first, second, and third transistors are configured such that the current source is configured to generate the output current through the second transistor to be smaller than a quiescent current through the third transistor.

In a sixteenth aspect, alone or in combination with one or more of the first through fifteenth aspects, the transconductance elements comprise a first pair of transistors having control inputs coupled to the differential inputs of the dynamic amplifier.

In a seventeenth aspect, alone or in combination with one or more of the first through sixteenth aspects, the dynamic amplifier further comprises a second pair of transistors coupled between the first pair of transistors and the differential outputs of the dynamic amplifier, the second pair of transistors having control inputs coupled to the control input of the dynamic amplifier.

In an eighteenth aspect, an analog-to-digital converter comprising the amplifier circuit of the first aspect.

In a nineteenth aspect, a receive path for a wireless device, the receive path comprising the analog-to-digital converter of the eighteenth aspect.

In a twentieth aspect, a pipelined analog-to-digital converter (ADC) comprising: a first converter stage having one or more inputs, a digital output, and differential residue outputs; a first amplifier circuit having differential inputs coupled to the differential residue outputs of the first converter stage, wherein the first amplifier circuit comprises: a dynamic amplifier having differential inputs coupled to the differential inputs of the first amplifier circuit, having differential outputs, and having a control input for controlling a time length of amplification for the dynamic amplifier; and a current source configured to generate an output current such that portions of the output current are selectively applied to the differential outputs of the dynamic amplifier during at least a portion of the time length of amplification; and a second converter stage having differential inputs and a digital output, wherein differential outputs of the first amplifier circuit are coupled to the differential inputs of the second converter stage.

In a twenty-first aspect, alone or in combination with the twentieth aspect, the first converter stage comprises: a sub-ADC having differential inputs coupled to the differential inputs of the first converter stage and having an output coupled to the digital output of the first converter stage; a digital-to-analog converter (DAC) having differential inputs coupled to the differential outputs of the sub-ADC; and a combiner having first differential inputs coupled to the differential inputs of the first converter stage, having second differential inputs coupled to differential outputs of the DAC, and having differential outputs coupled to the differential residue outputs of the first converter stage.

In a twenty-second aspect, alone or in combination with one or more of the twentieth and twenty-first aspects, the sub-ADC comprises a successive-approximation ADC.

In a twenty-third aspect, alone or in combination with one or more of the twentieth and twenty-second aspects, a second amplifier circuit, wherein the second converter stage has differential residue outputs and wherein the second amplifier circuit has differential inputs coupled to the differential residue outputs of the second converter stage; and a third converter stage having differential inputs and differential outputs, wherein differential outputs of the second amplifier circuit are coupled to the differential inputs of the third converter stage.

In a twenty-fourth aspect, alone or in combination with one or more of the twentieth and twenty-third aspects, the second amplifier circuit comprises: another dynamic amplifier having differential inputs coupled to the differential inputs of the second amplifier circuit, having differential outputs, and having a control input for controlling another time length of amplification for the other dynamic amplifier; and another current source configured to generate another output current such that portions of the other output current are selectively applied to the differential outputs of the other dynamic amplifier during at least a portion of the other time length of amplification.

In a twenty-fifth aspect, alone or in combination with one or more of the twentieth and twenty-fourth aspects, the second converter stage comprises: a sub-ADC having differential inputs coupled to the differential inputs of the second converter stage and having differential outputs coupled to the digital output of the second converter stage; a digital-to-analog converter (DAC) having differential inputs coupled to the differential outputs of the sub-ADC; and a combiner having first differential inputs coupled to the differential inputs of the second converter stage, having second differential inputs coupled to differential outputs of the DAC, and having differential outputs coupled to the differential residue outputs of the second converter stage.

In a twenty-sixth aspect, alone or in combination with one or more of the twentieth and twenty-fifth aspects, the second converter stage comprises a successive-approximation ADC.

In a twenty-seventh aspect, a method of signal amplification, comprising: controlling, via a control input of a dynamic amplifier, a time length of amplification for the dynamic amplifier, the dynamic amplifier comprising differential inputs, differential outputs, transconductance elements coupled to the differential inputs, and a first set of capacitive elements coupled to the differential outputs; generating, via a current source, an output current; and selectively applying portions of the output current to the differential outputs of the dynamic amplifier during at least a portion of the time length of amplification.

In a twenty-eighth aspect, alone or in combination with the twenty-seventh aspect, the method further comprises: the sensing a common-mode voltage of the differential outputs; and determining a difference between the common-mode voltage and a setpoint, wherein the generating comprises controlling the current source based on the difference.

In a twenty-ninth aspect, alone or in combination with one or more of the twenty-seventh and twenty-eighth aspects, the selectively applying comprises selectively coupling the current source to the differential outputs of the dynamic amplifier via a switch coupled between the current source and a second set of capacitive elements coupled to the differential outputs of the dynamic amplifier.

In a thirtieth aspect, alone or in combination with one or more of the twenty-seventh through twenty-ninth aspects, the generating comprises generating a dynamic output current.

Additional Considerations

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. An amplifier circuit comprising:
   a dynamic amplifier having differential inputs, differential outputs, transconductance elements coupled to the differential inputs, a first set of capacitive elements coupled to the differential outputs, and a control input for controlling a time length of amplification for the dynamic amplifier; and
   a current source configured to generate an output current such that portions of the output current are selectively applied to the differential outputs of the dynamic amplifier during at least a portion of the time length of amplification.

2. The amplifier circuit of claim 1, wherein the current source is configured to apply the portions of the output current to the differential outputs of the dynamic amplifier to reduce a common-mode voltage shift of the differential outputs during the at least the portion of the time length of amplification for the dynamic amplifier.

3. The amplifier circuit of claim 1, wherein the current source is selectively coupled to the differential outputs of the dynamic amplifier.

4. The amplifier circuit of claim 1, further comprising a feedback path coupled between the differential outputs of the dynamic amplifier and a control input of the current source.

5. The amplifier circuit of claim 4, wherein the feedback path comprises a common-mode sensor having inputs coupled to the differential outputs of the dynamic amplifier.

6. The amplifier circuit of claim 5, wherein the common-mode sensor comprises a switched-capacitor circuit.

7. The amplifier circuit of claim 5, wherein the feedback path further comprises an error amplifier having a first input coupled to an output of the common-mode sensor, having a second input coupled to a reference voltage node, and having an output coupled to the control input of the current source.

8. The amplifier circuit of claim 7, wherein the feedback path further comprises a low-pass filter coupled between the output of the error amplifier and the control input of the current source.

9. The amplifier circuit of claim 4, wherein the feedback path further comprises a switch coupled between the current source and a second set of capacitive elements coupled to the differential outputs of the dynamic amplifier.

10. The amplifier circuit of claim 9, further comprising an inverter, wherein the control input of the dynamic amplifier is coupled to an input of the inverter and wherein an output of the inverter is coupled to a control input of the switch.

11. The amplifier circuit of claim 1, wherein the current source comprises a current mirror having a first branch with a reference current source and having a second branch coupled to the differential outputs of the dynamic amplifier via a second set of capacitive elements.

12. The amplifier circuit of claim 11, further comprising a switch coupled between the second branch of the current mirror and the second set of capacitive elements.

13. The amplifier circuit of claim 12, further comprising an inverter, wherein the control input of the dynamic amplifier is coupled to an input of the inverter and wherein an output of the inverter is coupled to a control input of the switch.

14. The amplifier circuit of claim 11, wherein the dynamic amplifier further comprises a quiescent current source and wherein a control input of the quiescent current source is coupled to a control input of the reference current source.

15. The amplifier circuit of claim 14, wherein the first branch of the current mirror comprises a first transistor coupled to the reference current source, wherein the second branch of the current mirror comprises a second transistor, wherein the quiescent current source comprises a third transistor, and wherein the reference current source and the first, second, and third transistors are configured such that the current source is configured to generate the output current through the second transistor to be smaller than a quiescent current through the third transistor.

16. The amplifier circuit of claim 1, wherein the transconductance elements comprise a first pair of transistors having control inputs coupled to the differential inputs of the dynamic amplifier.

17. The amplifier circuit of claim 16, wherein the dynamic amplifier further comprises a second pair of transistors coupled between the first pair of transistors and the differential outputs of the dynamic amplifier, the second pair of transistors having control inputs coupled to the control input of the dynamic amplifier.

18. An analog-to-digital converter comprising the amplifier circuit of claim 1.

19. A receive path for a wireless device, the receive path comprising the analog-to-digital converter of claim 18.

20. A pipelined analog-to-digital converter (ADC) comprising:
a first converter stage having one or more inputs, a digital output, and differential residue outputs;
a first amplifier circuit having differential inputs coupled to the differential residue outputs of the first converter stage, wherein the first amplifier circuit comprises:
a dynamic amplifier having differential inputs coupled to the differential inputs of the first amplifier circuit, having differential outputs, and having a control input for controlling a time length of amplification for the dynamic amplifier; and
a current source configured to generate an output current such that portions of the output current are selectively applied to the differential outputs of the dynamic amplifier during at least a portion of the time length of amplification; and
a second converter stage having differential inputs and a digital output, wherein differential outputs of the first amplifier circuit are coupled to the differential inputs of the second converter stage.

21. The pipelined ADC of claim 20, wherein the first converter stage comprises:
a sub-ADC having differential inputs coupled to the differential inputs of the first converter stage and having an output coupled to the digital output of the first converter stage;
a digital-to-analog converter (DAC) having differential inputs coupled to the differential outputs of the sub-ADC; and
a combiner having first differential inputs coupled to the differential inputs of the first converter stage, having second differential inputs coupled to differential outputs of the DAC, and having differential outputs coupled to the differential residue outputs of the first converter stage.

22. The pipelined ADC of claim 21, wherein the sub-ADC comprises a successive-approximation ADC.

23. The pipelined ADC of claim 20, further comprising:
a second amplifier circuit, wherein the second converter stage has differential residue outputs and wherein the second amplifier circuit has differential inputs coupled to the differential residue outputs of the second converter stage; and
a third converter stage having differential inputs and differential outputs, wherein differential outputs of the second amplifier circuit are coupled to the differential inputs of the third converter stage.

24. The pipelined ADC of claim 23, wherein the second amplifier circuit comprises:
another dynamic amplifier having differential inputs coupled to the differential inputs of the second amplifier circuit, having differential outputs, and having a control input for controlling another time length of amplification for the other dynamic amplifier; and
another current source configured to generate another output current such that portions of the other output current are selectively applied to the differential outputs of the other dynamic amplifier during at least a portion of the other time length of amplification.

25. The pipelined ADC of claim 23, wherein the second converter stage comprises:
a sub-ADC having differential inputs coupled to the differential inputs of the second converter stage and having differential outputs coupled to the digital output of the second converter stage;
a digital-to-analog converter (DAC) having differential inputs coupled to the differential outputs of the sub-ADC; and
a combiner having first differential inputs coupled to the differential inputs of the second converter stage, having second differential inputs coupled to differential outputs of the DAC, and having differential outputs coupled to the differential residue outputs of the second converter stage.

26. The pipelined ADC of claim 20, wherein the second converter stage comprises a successive-approximation ADC.

27. A method of signal amplification, comprising:
controlling, via a control input of a dynamic amplifier, a time length of amplification for the dynamic amplifier, the dynamic amplifier comprising differential inputs, differential outputs, transconductance elements coupled to the differential inputs, and a first set of capacitive elements coupled to the differential outputs;
generating, via a current source, an output current; and
selectively applying portions of the output current to the differential outputs of the dynamic amplifier during at least a portion of the time length of amplification.

28. The method of claim 27, further comprising:
sensing a common-mode voltage of the differential outputs; and
determining a difference between the common-mode voltage and a setpoint, wherein the generating comprises controlling the current source based on the difference.

29. The method of claim 27, wherein the selectively applying comprises selectively coupling the current source to the differential outputs of the dynamic amplifier via a switch coupled between the current source and a second set of capacitive elements coupled to the differential outputs of the dynamic amplifier.

30. The method of claim 27, wherein the generating comprises generating a dynamic output current.

\* \* \* \* \*